United States Patent
Mattisson

(10) Patent No.: US 6,490,706 B2
(45) Date of Patent: Dec. 3, 2002

(54) HIGH Q GYRATOR STRUCTURES

(75) Inventor: Sven Mattisson, Bjärred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 209 days.

(21) Appl. No.: 09/726,908

(22) Filed: Nov. 30, 2000

(65) Prior Publication Data

US 2001/0047505 A1 Nov. 29, 2001

(30) Foreign Application Priority Data

Dec. 2, 1999 (DE) .......................... 199 58 096

(51) Int. Cl.[7] ............................................. G06F 17/50
(52) U.S. Cl. ............................................. 716/1; 716/18
(58) Field of Search ................... 716/1, 4, 18; 333/214, 333/215; 327/552–559

(56) References Cited

U.S. PATENT DOCUMENTS

| | | | |
|---|---|---|---|
| 4,812,785 A | 3/1989 | Pauker | 331/117 |
| 4,823,092 A | 4/1989 | Pennock | 330/253 |
| 4,839,542 A | 6/1989 | Robinson | 307/520 |
| 5,063,309 A | 11/1991 | Yamasaki | 307/521 |
| 5,192,884 A | 3/1993 | Kusano | 307/520 |
| 5,416,438 A | 5/1995 | Shibata | 327/552 |
| 5,625,317 A | 4/1997 | Deveirman | 327/353 |
| 6,285,865 B1 * | 9/2001 | Vorenkamp et al. | 327/554 |
| 6,404,308 B1 * | 6/2002 | Mattisson | 333/215 |

FOREIGN PATENT DOCUMENTS

| | | |
|---|---|---|
| DE | DT 2504530 A1 | 8/1976 |
| DE | 693 16 961 T2 | 8/1998 |
| JP | 07011291 | 8/1996 |
| JP | 07236698 | 3/1997 |
| RU | SU 545067 | 1/1977 |

OTHER PUBLICATIONS

Nauta, Bram: "A CMOS Transconductance–C Filter Technique for Very High Frequencies"; IEEE, vol. 27, No. 2, Feb. 1992; pp. 142–153.

Nauta, Bram; "Analog CMOS Filters for Very–High Frequencies"; pp. 32, 33, 86, 87, 92–101, 146, 147, 164, and 165.

Bram Nauta: "A CMOS Transconductance–C Filter Technique for Very High Frequencies" in IEEE Journal of Solid–State Circuits, vol. 2, Feb. 2, 1992. (pp.–142–153).

Franco Angeli, Milano, Internat. Lexikon der Wissenschaft und Technik, Bd I Halbeiter, Verlag Moderne Industrie Munchen, 1971, Universal Decimal Classification: 621.315.592:621:382, S. 958,959.

(List continued on next page.)

Primary Examiner—Matthew Smith
Assistant Examiner—Paul Dinh
(74) Attorney, Agent, or Firm—Jenkins & Gilchrist, P.C.

(57) ABSTRACT

The invention relates to a filter circuit and a method for making a filter circuit comprising at least one gyrator core section (GCi) having four inverters mutually connected in a loop configuration between a pair of input terminals (i_1; i_2) and a pair of output terminals (o_1; o_2). At least one common mode feedback section (CMIi, CMOi) is provided between the pair of input terminals and/or the pair of output terminals. The common mode feedback section comprises two series connections respectively formed by an inverter and a short-sectioned inverter connected antiparallelly between the input terminals or the output terminals. The inverters may be constituted by a MOS, CMOS or BiCMOS or bipolar transistor. According to the invention, the channel region dimensions of the transistors of the gyrator core section and/or the common mode feedback section are selected such that the relationship $g^*C \geq g_m^*c_m$ is fulfilled, where g is the effective conductive loading of the gyrator core section terminals, C is the effective capacitive loading of the gyrator core section terminals, $g_m$ is the effective gyration constant of the gyrator core section, and $c_m$ is the effective transcapacitance of the gyrator core section.

30 Claims, 3 Drawing Sheets

OTHER PUBLICATIONS

Seifart Manfred, Digitale Schaltungen, 3. Aufl. 1988, Huthig Verlag Heidelberg.

Bram Nauta: Analog CMOS Filters for Very–High Frequencies, Ph.D. Dissertation, Seiten 1–223, University Twente, Enschede, The Netherlands, Sep. 1991.

Telefunken Laborbuch Bd 1, 5. Ausgabe 1962, Hrsg. Telefunken GmbH, Ulm/Donau, Copyright 1957.

Form PCT/ISA/220/210, International Search Report for PCT/EP 00/11198. (3 pp.).

Deutsches Patent– und Markenamt, Jun. 26, 2001. (7 pp.).

* cited by examiner

HIGH Q GYRATOR STRUCTURES

FIELD OF THE INVENTION

The invention relates to a filter circuit consisting of at least one filter stage in which amplifier-like circuits such as integrators and/or gyrators are employed to emulate the impedance of inductors. The invention also relates to a method for making (designing) such filter circuit.

The invention in particular addresses the problem how complex (higher order) filters can be designed such that the actual filter characteristics obtained in the practically realized filter circuit coincide with the theoretically designed filter characteristics. The invention also addresses the problem how such complex (e.g. higher order) filters can be designed such that they are stable.

BACKGROUND OF THE INVENTION

As shown in FIG. 1, typically a filter circuit consists of a plurality of filter stages FST1 ... FSTi wherein the first filter stage FST1 is driven by a source, e.g. a current source CS and a source impedance SI, and the output of the last filter stage FSTi is terminated with an output impedance OI. As is well known to the skilled person the filter transfer function is essentially a polynomial consisting of a plurality of poles and zeros in the complex plane. Depending as to whether the individual filter stages FSTi are a filter stage of first order or higher order, a desired filter function and thus a desired filter characteristic can be obtained.

Hereinafter, it is assumed that each filter stage FSTi consists of a single transistor or gyrator. However, of course the invention is not restricted to each filter stage being of the said types but also higher order filter stages may be used.

Depending on the desired filter transfer function, each filter stage is realized by coils, resistors and capacitors. For example, on-chip filters are normally restricted to resistor/capacitor filter stages, except at very high frequencies where on-chip coils of a few nH may be employed. In such passive filter realizations (i.e. no active circuitry is employed in the filter stages FSTi) it therefore depends on how accurate or whether at all coils (more particular the coil impedance) can be realized by a passive coil construction.

As is also well known to the skilled person in the art of filter design, active on-chip filters are often used to circumvent the coil restrictions in passive filter circuits. In such active filters amplifier-like circuitry is used to emulate the impedance of the inductors. That is, the coils are replaced by an active circuit. For continuous-time filters such amplifier-like circuits typically consist of integrators or gyrators and for discrete-time circuits (digital filters) integrators are used for emulating the coils impedance.

Continuous-time filters implemented with integrators typically employ such elements in loops and these loops. Two integrators in a loop actually form a gyrator. If the forward and backward integrators have the same gain characteristics they form a passive gyrator and if they do not have the same gain characteristics they form an active (or asymmetric) gyrator. FIG. 2 shows a typical block diagram of a gyrator and its equivalent circuit diagram. The input voltage V1 and the output voltage V2 are linked via the gyration constant $g_m^*$ as $I1=-g_m^*V2$ and $I2=g_m^*V1$. Thus, the gyrator shown in FIG. 2 consists of a positive transconductance $g_m^*$ and a negative transconductance $-g_m^*$.

FIG. 3 shows a typical realization of the gyrator in FIG. 2 employing at least one common mode feedback section CMIi, CMOi and a gyrator core section GCi. As shown in FIG. 3, the negative transconductance $-g_m^*$ is typically formed by employing differential signals and crossing one pair of wires. That is, the gyrator core section GCi comprises four inverters GI1$i$–GI4$i$ mutually connected in a loop configuration between a pair of input terminals i_1; i_2 and a pair of output terminals o_1; o_2. The common mode feedback section CMIi, CMOi is connected between the pair of input terminals and/or the pair of output terminals and comprises two series connections respectively formed by an inverter CMI1, CMO1 and a short-circuited inverter CMI2, CMO2 connected antiparallely between said input terminals or said output terminals. It should be noted that one of the input or output common mode feedback sections CMIi, CMOi is sufficient for realizing the positive transconductance $g_m^*$ and that one gyrator core section GCi is sufficient for realizing the negative transconductance $-g_m$.

However, independent as to how the actual inverters are realized (by MOS, CMOS, BiCMOS or bipolar transistors), the crossing of the wires results in a loop through the four inverters GI1$i$, GI2$i$, GI3$i$, GI4$i$. FIG. 4 shows the realization of the inverters in FIG. 3 using two CMOS transistors T1 (e.g. NMOS) and T2 (e.g. PMOS) whose drains D and gates G are connected with the respective sources connected to ground. Similarly, the short-sectioned inverters would correspond to the circuit configuration shown in FIG. 4 with the input In and the output Out connected together.

Furthermore, gyrators realized by differential amplifier circuitry are possible, as shown in FIGS. 5a, 5b. FIG. 5a shows on the left-hand side the symbol for a transconductor realized by a differential amplifier and on right-hand side the inverter solution for such a differential type amplifier in CMOS technology is shown. Two inverters I1, I2 (e.g. having a circuit configuration as shown in FIG. 4) are respectively connected to a first and second current source CS1, CS2 which are biased by bias voltages bias1, bias2.

FIG. 5b shows the gyrator core section GCi of FIG. 3 using a differential transconductor configuration as in FIG. 5a. As shown on the left-hand side in FIG. 5b two differential transconductors DA1, DA2 are provided in a feedback loop and therefore, using the circuit configuration in FIG. 5a, this leads to a structure similar to that shown in FIG. 3, namely loop-like circuits in the gyrator core section GCi.

In FIG. 5b the circuit configuration of FIG. 5a is contained twice leading to two first current sources CS1, CS12 and to second current sources CS21, CS22, to first inverters I11, I12 and to second inverters I21, I22.

It should be noted that any gyrator configuration as shown in FIGS. 3, 4, 5 may be used for the filter circuit according to the invention as will be described below. That is, the present invention is not restricted to any particular gyrator constructions. However, any gyrator construction would lead to the loop-like circuit of the gyrator core section GCi as shown in FIG. 3. The only difference is that for the differential amplifier gyrator shown in FIG. 5b no common mode feedback is needed because in the differential transconductor a high CMRR (Common Mode Rejection Ratio) exists.

As explained above, the loop-like configuration of the gyrator leads to a stability problem and the stability analysis of the gyrator- and integrator-based filters is the same since the integrators are parts of gyrator loops. An analysis of the gyrators is thus valid for the integrator configuration as well.

DESCRIPTION OF THE PRIOR ART

The stability of filter circuits comprising a gyrator construction as shown in FIG. 3 has been studied by B. Nauta:

"A CMOS transconductance-C filter technique for very high frequencies in IEEE Journal of Solid-State Circuits, SC-27, pages 142–153, February 1992". In this prior art document the stability of the circuit in FIG. 3 (hereinafter called the Nauta cell) was conducted by assuming a MOS or CMOS transistor realization of the integrators in FIG. 3. As is well known to the skilled person in the field of transistor technology, each MOS or CMOS transistor has a channel region of a particular dimension and the time needed for transporting carriers through this channel (between the source and drain) will influence the switching properties of the CMOS or MOS transistor.

In a PhD thesis which is the basis for the afore-mentioned IEEE paper, Nauta presented a number of simple filters and complex intermediate-frequency (IF) filters. The filter structures of lower order did work well but the more complex ones (higher order filters) had a very poor frequency response. In particular, the measured filter characteristics deviated from the theoretically expected filter characteristic to more than 10 dB. Furthermore, stability problems occurred and for making the filter circuits stable a separate Q-tuning circuit (separate supply voltage for the ballast inverters in the common mode feedback network) was used to enable an external adjustment. Basically, the adding of ballast devices or the sizing of the inverters in the common mode feedback sections reduces the dependence of the filter circuit on the output conductance of the filter and thus leads to more stable filter characteristics. Whilst Nauta achieved to make the filter stable by the adding of the Q-tuning circuits, the filter characteristics significantly deviated from the expected behavior. Thus, obviously merely adding ballast inverters in the common mode feedback network is not sufficient to keep stability and achieve the desired filter characteristic. Furthermore, each individual gyrator would require a separate Q-tuning loop.

Lower-order filters comprising Nauta cells do work because the external terminations provide a sufficient loading of the gyrator to make it stable. On the other hand, higher-order filters tend to have internal nodes that do not get sufficient loading to make the filter stable.

Thus, no complex active continuous-time on-chip MOS filter has been successfully fabricated in products due to the unreliability of the gyrator cell in terms of stability and the only workable examples are limited to lower-order filters or cascades of low-order filters (with inferior sensitivity characteristics).

SUMMARY OF THE INVENTION

Therefore, as explained above, the object of the present invention is to provide a filter circuit comprising at least one filter stage including at least one gyrator and a method for making such a filter circuit such that the filter circuit is stable also when higher-order filter stages are used and such that the practically obtained filter characteristic matches the theoretically expected filter characteristic.

This object is solved by the filter circuit (claim 11) consisting of at least one filter stage which comprises: a gyrator core section having four inverters mutually connected in a loop configuration between a pair of input terminals and a pair of output terminals; at least one common mode feedback section connected between the pair of input terminals and/or the pair of output terminals and comprising two series connections respectively formed by an inverter and a short-sectioned inverter connected anti-parallely between said input terminals or said output terminals; each of said inverters being constituted by at least one MOS, CMOS or BiCMOS transistor having a gate, drain, source and a channel region between said drain and source; wherein the channel region dimensions of the transistors of the gyrator core section and/or the common mode feedback section are selected such that the following relationship is fulfilled: $g^*C \geq g_m^*c_m$ where:
g: effective conductive loading of the gyrator core section terminals; C: effective capacitive loading of the gyrator core section terminals; $g_m$: effective gyrating constant of the gyrator core section; and $c_m$: effective transcapacitance of the gyrator core section.

Furthermore, this object is also solved by a method (claim 1) for making a filter circuit consisting of at least one filter stage which comprises the following steps:
providing said at least one filter stage with a gyrator core section having four inverters mutually connected in a loop configuration between a pair of input terminals and a pair of output terminals; and providing at least one common mode feedback section connected between the pair of input terminals and/or the pair of output terminals and comprising two series connections respectively formed by an inverter and a short-sectioned inverter connected anti-parallely between said input terminals or said output terminals; each of said inverters being constituted by at least one MOS, CMOS or BiCMOS transistor having a gate, drain, source and a channel region between said drain and source; including the following step: selecting the channel region dimensions of the transistors of the gyrator core section and/or the common mode feedback section such that the following relationship is fulfilled: $g^*C \geq g_m^*c_m$ where: g: effective conductive loading of the gyrator core section terminals; C: effective capacitive loading of the gyrator core section terminals; $g_m$: effective gyrating constant of the gyrator core section; and $c_m$: effective transcapacitance of the gyrator core section.

Furthermore, the object is solved by a method for making a filter circuit consisting of at least one filter stage FSTi which comprises the following steps:
providing S1 said at least one filter stage FSTi with a gyrator core section GCi having four inverters I1, I12, I22, I21 mutually connected in a feedback loop between a pair of input terminals i_1, i_2 and a pair of output terminals o_1, o_2; wherein the inverters are arranged as a differential transconductor configuration, such that a first and second inverter I11, I21 are respectively provided between the first input and first output terminal i_1; o_2 and the second input terminal and the second output terminal i_2; o_2; each of said inverters being constituted by at least one MOS, CMOS or BiCMOS transistor having a gate G, drain D, source S and a channel region CH between said drain D and source S;
selecting S4 the general region dimensions CL, CB of the transistors of the gyrator core section such that the following relationship is fulfilled: $g^*C \geq g_m^*c_m$
where: g: effective conductive loading of the gyrator core section terminals; C: effective capacitive loading of the gyrator core section terminals; $g_m$: effective gyrating constant of the gyrator core section; and $c_m$: effective transcapacitance of the gyrator core section.

Furthermore, this object is solved by a filter circuit consisting of at least one filter stage FSTi, which comprises:
at least one filter stage FSTi with a gyrator core section GCi having four inverters I1, I12, I22, I21 mutually connected in a feedback loop between a pair of input terminals i_1; i_2 and a pair of output terminals o_1; o_2; wherein the inverters are arranged as a differential transconductor configuration, such that a first and second inverter I11, I21 are respectively provided between the first input and first output terminal i_1; o_1 and the second input terminal and the second output terminal i_2; o_2; each of said inverters being constituted by at least one MOS, CMOS or BiCMOS transistor having a gate G, drain D, source S and a channel region CH between said drain D and source S; the general region dimensions CL, CB of the transistors of the gyrator core section being selected such that the following relationship is fulfilled: $g*C \geq g_m*c_m$
where: g: effective conductive loading of the gyrator core section terminals; C: effective capacitive loading of the gyrator core section terminals; $g_m$: effective gyrating constant of the gyrator core section; and $c_m$: effective transcapacitance of the gyrator core section. According to the invention the problem was discovered that the channel delay of the transistor structures used in the gyrator circuits actually make the circuit unstable and causes the deviation from the actual filter characteristic from the expected theoretical filter characteristic. According to the invention it was realized that the non-quasi-static behavior of the channel charge does indeed add a parasitic pole in the transconductance of the device. This extra pole or delay makes the gyrator unstable and therefore must be designed properly. Whenever the channel delay becomes significant, it is therefore necessary to design the channel region dimension such that $g*C \geq g_m*c_m$ is fulfilled. It is also not necessary to add Q-tuning to the ballast inverters in the common mode feedback network. If the channel region dimensions of the MOS transistors are designed to fulfill this condition also higher-order filters with excellent filter characteristics can be provided.

According to a first aspect of the invention the channel region dimensions are changed differently in the gyrator core section and in said common mode feedback section. The channel region dimensions of the common mode feedback section transistors can be kept constant and the channel region length of the gyrator core section can be reduced whereby the transadmittance of the respective transistor is changed. Thus, the devices are shortened such that the open-circuit voltage gain of the devices is low enough not to cause instability.

According to a second aspect of the invention the channel region dimensions of the common mode feedback section transistors are kept constant and the channel region length and the channel region width of the gyrator core section is reduced wherein the transmittance of the respective transistor is kept constant such that the resonance frequency of the core section $\overline{\omega}_{Tcore}$ is larger than the resonance frequency of the filter circuit $\omega_{Ofilter}$. Therefore, the gyrator-core devices can be scaled down such that their delay becomes insignificant.

According to a third aspect of the invention, when the channel region dimensions have been designed such that the overall filter fulfills $g*C \geq g_m*c_m$, additional ballast inverters can be added to the common mode feedback section. Essentially, the channel region width of the transistors of the common mode ballast inverters in the common mode feedback section is increased. That is, the CM ballast inverter channel region is widened and one must discriminate here between the CM ballast inverter connected to one terminal (CMI2 and CMO2) whose width is actually increased and the CM inverters connected between terminals (CMI1, CMO1) whose width can be kept constant.

Preferably, the channel length of the CM inverters (CMI1 and/or CMO1) can be made longer (even though this may be inferior to widening CMx2) as this will create a similar gain imbalance.

According to a fourth aspect of the invention, the aforementioned stability criteria and further stability criteria discussed hereinafter can be employed for a filter circuit which is formed by a differential transconductor configuration in a feedback loop without additional common mode feedback sections.

The above-mentioned schemes are applicable to symmetrical and asymmetrical realizations of the inverters.

Further advantageous embodiments and improvements of the invention can be taken from the dependent claims. Furthermore, it should be noted that the invention is not restricted to the embodiments and examples described hereinafter and that further embodiments of the invention may comprise features which have been described separately in the claims and in the description. Hereinafter, embodiments of the invention will be described with reference to the drawings.

Figure 1:
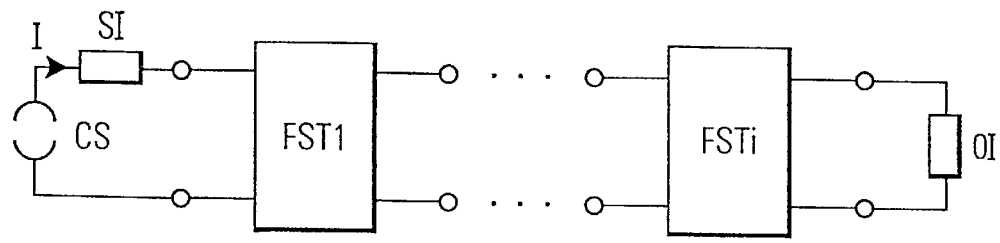
FIG. 1 shows a typical filter circuit comprising a number of filter stages FST1 . . . FSTi according to the prior art.
Figure 2:
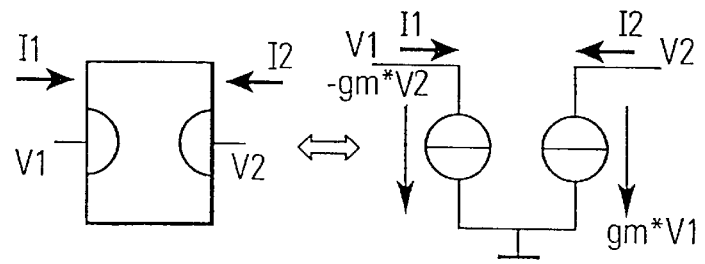
FIG. 2 shows an equivalent circuit diagram of a gyrator.

It should be noted that in the drawings the same or similar reference numerals are used and that the filter circuit according to the invention can use any gyrator core constitution realized by MOS, CMOS, BiCMOS or bipolar transistors. The invention is also not restricted to the differential transconductor structure of FIG. 5b or the construction of FIG. 3.

PRINCIPLE OF THE INVENTION

Hereinafter, the principle of the invention will be described with respect to a stability analysis of the Nauta cell shown in FIG. 3. However, as explained above, a similar stability analysis will hold for FIG. 5b. Furthermore, the stability analysis is also not restricted to MOS, CMOS or BiCMOS gyrator construction and also a bipolar transistor construction of the gyrator can be subjected to the stability analysis. As such the bipolar transistor does not comprise a channel, however, there is a delay associated with the base transport. Thus, in both technologies there is a base or gate delay, i.e. the drain/collector current does not react immediately to a gate/base terminal voltage change due to this delay. An extra delay then depends on the MOS channel length or the bipolar base spreading resistance and transit time.

The inventors considered several issues when designing filter gyrators based on the Nauta cell. In particular, the gyrator stability Q-value and the matching properties and noise was investigated. Matching is not such an important aspect but is in general improved when the device dimensions increase. Noise has already been described in the afore-mentioned IEEE paper.

Figure 3:
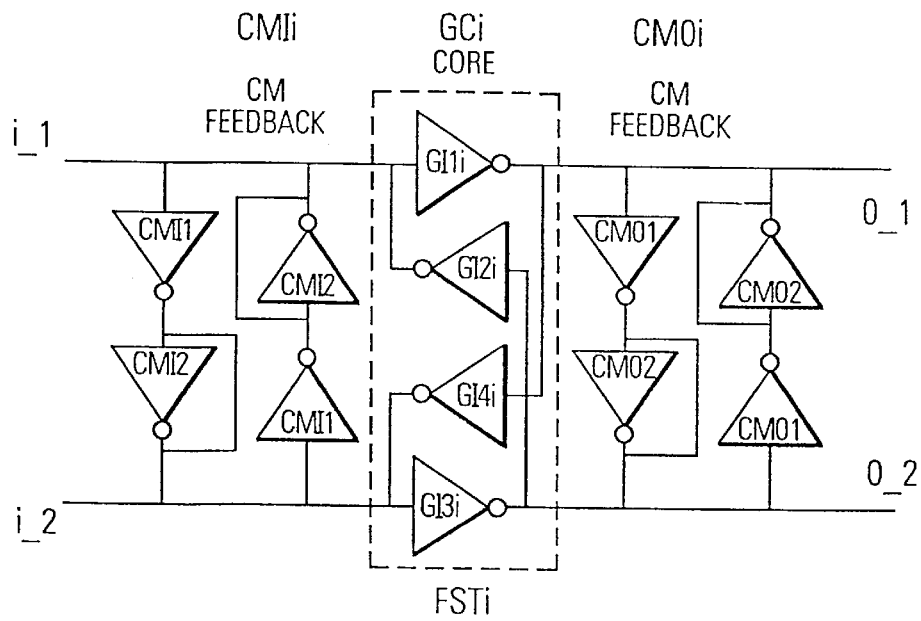
FIG. 3 shows a differential signal type gyrator circuit comprising a core section GCi and common mode feedback sections CMIi, CMOi according to the prior art.

Essentially, the principle of the present invention is based on the idea that a stability analysis is carried out for the Nauta cell gyrator structure of FIG. 3 including the channel delay, i.e. the channel dimensions of the transistors used for realizing the inverters and short-sectioned inverters. The admittance matrix of the configuration in FIG. 3 can be derived as follows:

$$Y_{inv} = \begin{pmatrix} yi+yf & -yf \\ ym-yf & yo+yf \end{pmatrix}, \quad (1)$$

Herein $y_i$ is the input admittance, $y_o$ is the output admittance, $y_f$ is the transadmittance from output to input and $y_m$ is the transadmittance from input to output. That is, the complete admittance $Y_{short}=(y_i+y_o+y_m)$. The admittance matrix $Y_{core}$ of the gyrator core section can be derived as follows:

$$Y_{core} = \begin{pmatrix} yl+yf & -yf & & ym-yf \\ ym-yf & yl+yf & -yf & \\ & ym-yf & yl+yf & -yf \\ -yf & & ym-yf & yl+yf \end{pmatrix}, \quad (2)$$

The admittance matrix of the common mode feedback block can be defined as $Y_{CM}$:

$$Y_{CM} = \begin{pmatrix} 2yl+ym & & ym-2yf & \\ & 2yl+ym & & ym-2yf \\ ym-2yf & & 2yl+ym & \\ & ym-2yf & & 2yl+ym \end{pmatrix}, \quad (3)$$

In both equations yl=yi+yf+yo. Thus, a complete gyrator admittance matrix $Y_{gyr}$ is derived by adding the two admittance matrixes $Y_{core}$, $Y_{CM}$ as follows:

$$Y_{gyr} = \quad (4)$$

$$\begin{pmatrix} 3yl+ym+yf & -yf & ym-2yf & ym-yf \\ ym-yf & 3yl+ym+yf & -yf & ym-2yf \\ ym-2yf & ym-yf & 3yl+ym+yf & -yf \\ -yf & ym-2yf & ym-yf & 3yl+ym+yf \end{pmatrix}$$

Two kinds of stability problems can occur in the Nauta cell. Firstly, when oscillating in the common mode the inputs and outputs are in phase and for example $v_{i1}=v_{i2}$ (where $V_{i1}$ and $V_{i2}$ denode the voltages between the inputs i_1, i_2 versus ground). The common mode feedback network CNIi by Nauta ensures that this cannot happen since the loop gain is limited to ½ for common mode signals. Therefore, the only stability problem which needs to be analyzed is for the differential case where the following relations apply for the differential signals:

$$v_{i1} = -v_{i2}$$

$$v_{o1} = -v_{o2}$$

$$i_{i1} = -i_{i2}$$

$$i_{o1} = -i_{o2} \quad (5)$$

wherein $v_{i1}$, $v_{i2}$ and $v_{o1\ and\ vo2}$ are the respective voltages at the input and output terminals i_1; i_2 and o_1; o_2 and $i_{i1}$, $i_{i2}$ and $i_{o1}$ and $i_{o2}$ are the respective currents at the input and output terminals.

Equations (4), (5) can be used for carrying out a stability analysis for the general case where it is not necessarily assumed that all inverters (transistors) are identical. That is, the matrix elements of $Y_{gyr}$ contain the respective values of individual realizations of the inverters.

When the differential signal assumptions of equation (5) are used, then it is possible to simplify the problem by deleting the last two rows and subtract the last two columns from the first two of equation (4). This results in a reduced admittance matrix for the differential operation of the Nauta gyrator cell that is easier to analyse. Thus, equation (4) can be reduced to:

$$Y_{gyr} = \begin{pmatrix} 3(yi+2yf+yo)+\Delta ym & -ym \\ ym & 3(yi+2yf+yo)+\Delta ym \end{pmatrix}, \quad (6)$$

This equation can be further simplified if $Y_l=3(Y_i+2Y_f=Y_0)$ is defined. This leads to the following equation:

$$Y_{gyr} = \begin{pmatrix} Yl+\Delta ym & -ym \\ ym & Yl+\Delta ym \end{pmatrix}, \quad (7)$$

$\Delta_{Ym}$ represents the difference between the transadmittances and represents the gain imbalance in the common-mode feedback inverters (typically some 1–10% of $y_m$).

In equation (7) for the gyrator admittance matrix $Y_{gyr}$ the important transadmittance $y_m$ occurs. Depending on the realization of the respective inverters (CMOS, MOS, BiMOS or bipolar) $y_m$ constitutes a specific delay of the transistor. As explained above, in the MOS case $y_m$ is linked to the channel region dimensions or the channel delay and in the bipolar realization $y_m$ corresponds to the base delay. Thus, one can say that $y_m$ represents a contribution which is due to the delay of the collector/emitter current with respect to the gate/base current. Hereinafter, a special case of a MOS transistor will be considered, however, similar considerations hold for the derivation in case of bipolar transistors.

When the Nauta gyrator circuit is implemented by MOS transistors, it can be assumed that $y_i=C_{gs}$, $y_f=C_{gd}$ and $y_o=gd$. Herein, $C_{gs}$ represents the gain/source capacity $C_{gs}$, $C_{gd}$ represents the gain/drain capacities and $g_d$ represents the output conductance of the transistor. If the load is dominated by external high-Q capacitors $C_0$ (i.e. the total effective capacitance between the gyrator core terminals due to the common mode feedback section and/or additional external capacitances, this capacitance has to be added to the diagonal elements of equation (7). If $Y_i$ is expanded as $Y_i=s*C+g$, then the following values are obtained for $Y_i$:

$$C=C_0+3C_{gs}+6C_{gd} \quad (8.1);$$

$$g=3g_D \quad (8.2).$$

If the total effective capacitance is dominated by the external load, then $C \approx C_0$ is satisfied.

At this stage it should be noted that also other approximations for $y_i$ can be used, e.g. for a CMOS realization one has to put $y_i=C_{gs}N+C_{gsP}$. A skilled person can make derivations for different types of transistors on the basis of the teachings contained herein.

The only missing parameter for the stability analysis is the MOS transadmittance $y_m$. In the afore-mentioned IEEE paper the MOS transadmittance $y_m$ has been assumed to be purely conductive and it was assumed that a stable system can always be obtained. That is, in the conventional filters the channel delay, which does add a parasitic pole in the transconductance of the device, has not been considered. However, as will be seen below, this extra pole or delay makes the gyrator unstable if not designed properly. Only under special circumstances, if the gyrator is for example loaded with resistive filter terminations, the entire circuit may be stable even though the gyrator core itself is unstable. This is one reason why simpler filters as given in the IEEE paper actually do not exhibit any stability problem whilst more complex ones (higher-order) do not work.

According to the invention it has been realized that $y_m$ is an influential parameter in the stability analysis and that it is not justified to assume it to be purely conductive. Therefore, according to the principle of the invention the non-quasi-static channel delay for the non-quasi-static MOS transadmittance $y_m$ (or a corresponding feature in the bipolar transistor realization) is modeled as:

$$ym = gm e^{s \cdot \tau gm} \approx \frac{g}{1+s \cdot \tau gm} \approx gm - s \cdot c_{m'} \quad (9)$$

where $\tau_{gm}=2/E\omega_T$ and $c_m=2C_{gs}/E$ with $E \approx 5$. The values of $y_m$, $\tau_{gm}$ and E are known from standard MOS transistor technology handbooks (see for example Y P. Tsvidis "Operation and modeling of the MOS transistor, McGraw-Hill New York, 1988").

As can be seen from equation (9), the MOS transadmittance $y_m$ is actually a pure delay (a circle in the S-plane) and this can be approximated either by using a pole approximation or by a right half-plane zero. Since the exact delay equation (the first term in equation (9)) leads to transcendental equations when solving the characteristic equations, hereinafter, pole and zero approximations are used. It can be shown that the pole and zero approximations of the MOS transadmittance $y_0$ lead to the same phase lag which is important for the stability analysis. The zero approximation gives /$y_m$/ a high-pass characteristic and a pole approximation leads to a low-pass characteristic. The pole approximation is more realistic but is more complex to analyze. Therefore, hereinafter, the zero approximation is used for deriving the stability criterion according to the invention.

Using the zero approximation $y_m=g_m-s^*c_m$, the characteristic equation of equation (7) can be derived as follows:

$$\Delta=(Yl+\Delta ym)^2+y^2m=s^2 \cdot (C^2+c^2m)+2s \cdot (g \cdot C-gm \cdot c_m)+g^2+g^2m, \quad (10)$$

where $\Delta y_m$ has been assumed to be negligible, i.e. the difference between the transfer admittances in the common-mode feedback inverters has been assumed to be zero. That is, the above-mentioned equation (10) has been derived on the basis of using differential signals, using a zero approximation and using identical transistors in the common-mode feedback circuit in the gyrator core section.

A sufficient and necessary requirement for equation (10) to be stable is that all coefficients in the s-polynomial are positive. Then, the stability criterion $$g \cdot C > gm \cdot cm, \quad (11)$$

may be derived. It must be noted that this stability criterion is novel over the IEEE document since equation (11) has been derived by assuming that the channel delay (base delay in a bipolar transistor) as an additional delay must not be neglected.

In this equation g and c as well as $g_m$ and $c_m$ correspond to the values obtained in equation (8.1), (8.2) and (9). In particular, a zero approximation for $y_m$ has been used.

It should be noted that the pole approximation $y_m=g_m/(1+S^*\tau_{gm})$ leads to the same stability criterion when deriving a characteristic equation for the characteristic equation (7). Therefore, there is no necessity to explicitly explain the pole approximation here.

The important conclusion is that equation (11) gives a specific relationship which must be fulfilled in order that the gyrator core section is stable independent of the frequency and independent of the complexity of the inverter realizations.

Although the principle of the invention has been described above with reference to the symmetric case where g, C, $g_m$ and $c_m$ are described by the above equations (8.1), (8.2) and (9), it may be noted that even for the asymmetrical case a similar relationship is fulfilled. Therefore, independent as to whether or not all transistors are identical, a general relationship like equation (11) is fulfilled.

Thus, in the general case g will be the effective conductive loading of the gyrator core section terminal, C will represent the effective capacitive loading of the gyrator core section terminals, $g_m$ will be the effective gyration constant of the gyrator core section, and $c_m$ will be the effective transcapacitance of the gyrator core section. Therefore, the above relationship (11) is not restricted to the special symmetrical case.

However, for the symmetrical and for the asymmetrical case the important realization of the invention is the same, namely that the non-quasi-static channel delay of the equation (9) should not be neglected for the stability analysis and should be selected such that equation (11) is satisfied. As shown with equation (9) $g_m$ and $c_m$ respectively describe the effective gyration constant or the resistive part of the MOS transadmittance $y_m$ and the effective transcapacitance of the gyrator core section or the capacitive part of the MOS transadmittance $y_m$.

According to the invention the channel region dimensions of the transistors of the gyrator core section and/or the common-mode feedback section must therefore be selected such that g, C and $g_m$, $c_m$ fulfill equation (11).

Various embodiments of the invention can be designed on the basis of this realization.

Comparison with a Design According To Nauta

As explained above, in the IEEE journal prior art document and the corresponding PhD thesis the channel delay (e.g. equation (9)) was not considered and the stability criterion (11) was not used.

Essentially, Nauta suggested to add additional Q-tuning loops in the common-mode feedback section, together with keeping the devices as small as possible. That is, Nauta suggested to shorten all devices in the common-mode feedback circuit and the gyrator core section and to add an external capacitance. In terms of equation (11) this would lead to an increase of g and a reduction of $c_m$. Therefore, following Nauta's design rule the condition (11) was fulfilled but required external capacitances and caused more mismatch (i.e. coefficient spread) and only works when the $\omega_0$ of the filter is much smaller than $\omega T$. Furthermore, smaller filters with terminations (additional capacitance) also assume a high g due to the terminations. However, this does not work for complex filters.

Nauta did not consider that the channel region dimensions must be optimized with respect to mismatch and stability simultaneously, and his design rule did not indicate that the channel region dimensions should be selected such that equation (11) is satisfied.

That is, Nauta did a quick analysis of the channel delay and concluded that it was not a problem since one would use short channels anyway. That is, Nauta only considered short channels (i.e. close to the technology minimum feature size which will result in a delay that is less than 1/fT). Using such short channels a device mismatch will, for more complex filters, cause filters with such short channels to have a large variation in transfer characteristics (i.e. they will not be generally useful).

The following embodiments can be devised on the basis of the equation (11) having realized that the channel delay (or the channel region dimensions such as width and length) should be taken into account.

First Embodiment

The first embodiment of the invention relates to the filter circuits shown in FIG. 3 consisting of at least one filter stage FSTi which comprises a filter circuit consisting of at least one filter stage FSTi which comprises: a gyrator core section GCi having four inverters GI1$i$–GI4$i$ mutually connected in a loop configuration between a pair of input terminals i_1; i_2 and a pair of output terminals o_1; o_2; at least one common mode feedback section CMIi, CMI connected between the pair of input terminals and/or the pair of output terminals and comprising two series connections respectively formed by an inverter CMI1, CMO1 and a short-sectioned inverter CMI2, CMO2 connected antiparallely between said input terminals or said output terminals; each of said inverters being constituted by at least one MOS, CMOS or BiCMOS transistor having a gate G, drain D, source S and a channel region CH between said drain D and source S; wherein the channel region dimensions CL, CW of the transistors of the gyrator core section and/or the common mode feedback section are selected such that the following relationship is fulfilled:

$$g * C > g_m * c_m \quad (16.1)$$

where:
g: effective conductive loading of the gyrator core section terminals;
C: effective capacitive loading of the gyrator core section terminals;
$g_m$: effective gyrating constant of the gyrator core section; and
$c_m$: effective transcapacitance of the gyrator core section;

The first embodiment is based on the shortening of the core devices with regard to the common-mode feedback devices. Therefore, the open-circuit voltage gain of the devices is low enough not to cause an instability. That is, according to the first aspect the channel region dimensions are selected to be different in said gyrator core section and in said common-mode feedback section (whilst Nauta had suggested to use the same size for all devices).

The shortening of the core devices leads to an increase of g and a substantial reduction of $c_m$. Therefore, the channel region dimensions of the common-mode feedback section transistors are kept constant and the channel region length of the gyrator core section devices is reduced wherein the transadmittance $y_m$ of the respective transistors is changed. This stabilizes the filter/gyrator core but has some mismatch problems. On the other hand, this design strategy already removes the need of a Q-tuning loop as in the IEEE journal prior art. This is especially important as Q-tuning does not work the way originally proposed, at least not for complex filters. With the proposed design strategy according to the first embodiment a Q-tuning loop will work better but will be more or less redundant.

Second Embodiment

According to a second embodiment of the invention the equation (11) is fulfilled by keeping the channel region dimensions of the common mode feedback section transistors constant and by reducing the channel region length as well as the channel region width of the gyrator core section transistors, wherein the transadmittance of the respective transistor is kept constant such that the resonance frequency of the core section $\omega_{Tcore}$ is larger than the resonance frequency of the filter circuit $\omega_{0filter}$. The second embodiment leads to a filter circuit which is still sensitive with respect to the transistor output conductance $g_d$ as does a filter circuit according to the first embodiment.

However, since according to the second embodiment the gyrator core devices (transistors) are scaled down, the matching with respect to the external capacitance is maintained. In the second embodiment $c_m$ is therefore reduced also substantially since the length as well as the width of the channel region is reduced in order to fulfill equation (11).

Third Embodiment

According to a third embodiment of the invention the transistors of the gyrator core section are kept constant with respect to their channel region length and the channel region width of the common mode ballast inverters CMI2, CMO2 of the common mode feedback section transistors is increased. Keeping the core transistors constant and increasing the channel width of the common mode feedback transistors leads to a substantial increase in g. The increasing of the width of the common mode feedback section transistors can be achieved by adding in parallel to the inverters, e.g. the ballast inverters CMI2, CMO2, in the common mode feedback section ballast inverters.

The criterion according to the third embodiment is the most attractive one as it is only sensitive to fundamental device characteristics (forward gain, transit frequency and channel delay relative to the transit frequency) which are better characterized, controlled and modeled than for example the transconductance $g_d$ from which g depends.

The design solution is then to choose one of the above schemes and individually tune each filter gyrator or integrator loop with all external capacitors added for maximum stable Q. The resulting circuit will have near ideal transfer characteristics and low sensitivity to device variations since an additional channel delay has been considered in the design equation (11).

Preferably, the channel length of the CM inverters (CM1 and/or Cmo1) can be made longer (even though this may be inferior to widening CMx2) as this will create a similar gain imbalance.

Fourth Embodiment

As explained above, the core idea of the present invention is to incorporate the channel delay in the stability analysis of equation (11). Therefore, one can say that the core principle of the invention is to individually dimension the channel of the gyrator MOS transistors and/or integrators to cancel out the effects of the channel delay and the limited open-circuit voltage gain which could lead to equation (11) not being fulfilled.

Figure 6:
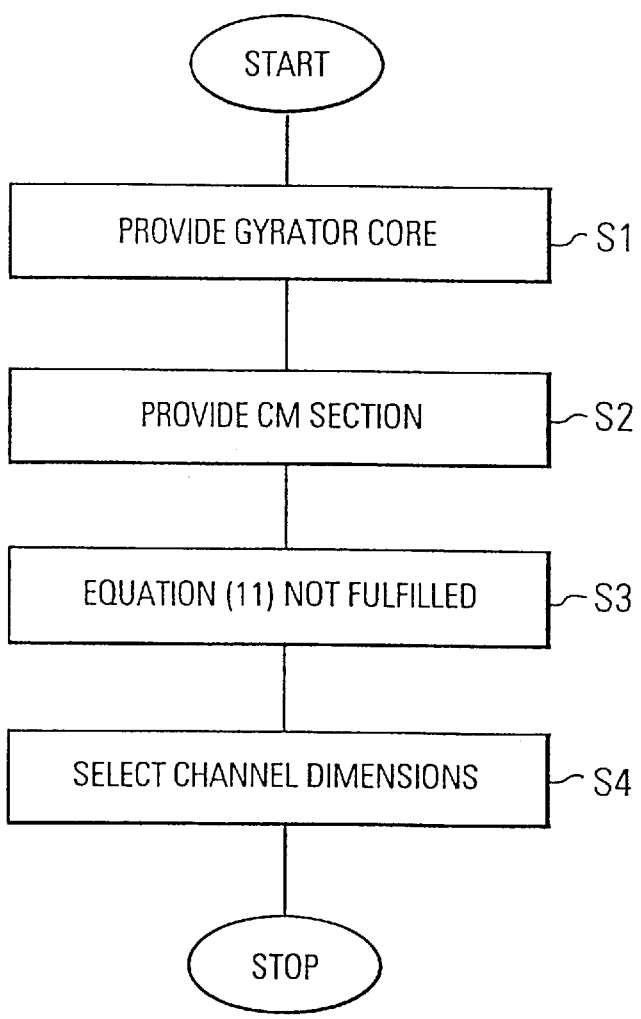
FIG. 6 shows a flow chart of the design method according to the invention.

As shown in FIG. 6, a flow chart for designing a stable filter circuit according to the invention comprises steps S1–S4. In step S1 the filter circuit, more precisely the individual filter stage FSTi is provided with the gyrator core section transistors. In step S2 at least one common mode feedback section is added at the input or at the output terminals. By a contrast to the design of Nauta, it can be assumed at this stage that equation (11) is not fulfilled in step S3.

The idea of the invention is now to select in step S4 the channel region dimensions of the transistors of the gyrator core section and/or the common mode feedback section such that the equation (11) is satisfied.

The selection of the channel dimensions can then be performed in step S4 according to the first, second and third embodiment individually.

Fifth Embodiment

It is also possible to combine the first and the third embodiment. That is, the channel region length of the gyrator core section can be reduced wherein the transadmittance of the respective transistor is changed and at the same time the channel region width of the common mode feedback section is increased according to the third embodiment, until equation (11) is satisfied.

It is also possible to combine the second and the third embodiment. That is, the channel region length and the channel region width of the gyrator core section transistors is reduced wherein the transadmittance of the respective transistor is kept constant whilst the channel region width of the common mode feedback section is increased.

Furthermore, it is possible that all transistors in the common mode feedback section and the gyrator core section are identical or it is possible that all transistors in the common mode feedback section and the gyrator core section are different. If it is assumed that all transistors in the common mode feedback section and the gyrator core section are identical then the transistors of each of the inverters comprise a transistor structure having a gate/source capacity $C_{gs}$, a gate/drain capacity $C_{gd}$, an output conductance $g_d$ and a transadmittance $y_m$ consisting of a resistive part $g_m$ and a capacitive part $c_m$ wherein the values in equation (11) are defined as:

$$C = C_0 + 3C_{gs} + 6C_{gd} \quad (8.1)$$

$$g = 3g_D \quad (8.2).$$

wherein $C_0$ is the total effective capacitance between the gyrator core terminals due to the common mode feedback section and/or additional external capacitances. If symmetrical signals are used $C_0$ corresponds to the total effective capacity between the input or output terminals.

Furthermore, it should be noted that all transistors can be operated in saturation and that the filter circuit may be a differential signal type filter circuit. Furthermore, it should be noted that any of the circuit configurations described in FIG. 5a and FIG. 5b, i.e. a differential transconductor realization of the gyrators is possible. Therefore, what has been said for the design of the Nauta cell structure in FIG. 3 equally well applies to the structure in FIG. 5b.

Sixth Embodiment

Furthermore, a special embodiment of the invention is when a channel delay and the gyrator open-circuit voltage gain cancel each other, i.e.:

$$g*C = g_m * c_m \quad (12).$$

In this case the resulting Q is very high (infinite in the nominal case) enabling high Q circuits with low-Q active devices. For the special relationship (12) less external terminations maximize the filter Q whilst setting $g*C \gg g_m*c_m$ results in a very low Q.

Seventh Embodiment

As explained above, the requirement to fulfill equation (11) can result in making $c_m$ sufficiently small by making the gyrator-core inverter transistors shorter than the common-mode feedback ones (i.e. $\omega_t \gg \omega_0$) or by loading the cell resistively (i.e. increase g) by adding ballast inverters (something that Nauta did with the Q-control).

Using equation (11) and assuming typical long-channel device parameters:

$$\frac{ym}{yo} = A_0 = 300 \quad (13)$$

$$\frac{yi}{cm} = \frac{Cgs}{cm} = 2.5,$$

$$C = C_0$$

the following special relationship holds for $c_m$:

$$cm = \frac{2C_{gsgyr}}{\varepsilon} < \frac{g}{gm}C_o \approx \frac{3C_o}{A_0} \approx \frac{C_o}{100}, \quad (14)$$

By making the gyrator-core devices shorter the $\omega^t$ (resonance frequency) of the core devices is increased and therefore the $c_m$ is decreased with the same amount as $\omega t$ is increased. Since typically $c_m = 2.5*C_{gs}$ the following relationship can be obtained:

$$C_{gsgyr} < \frac{C_o}{40}, \quad (15)$$

When shortening the gyrator-core devices their width has to be narrowed with a similar amount to preserve $g_m$ to be constant. This scaling or shortening of the devices will increase $g_d$ proportionally and the resistive losses in the gyrator increases making equation (15) overly conservative. However, equations (14) and (15) can be used when assuming typical long-channel device parameters of equation (13). $C_0$ in the above equations (13)–(15) is the total effective capacitance between the gyrator core terminals.

Eight Embodiment

The above relationships (13)–(15) were derived on the basis of the zero model approximation for the stability equation (11). As explained above, the pole model approximation yields the same result. These results are applicable for MOS transistors and model the channel delay by a zero or a pole approximation for the case of selecting identical transistors in the common mode feedback section and the core section.

However, also the MOS transistor input admittance makes an influence on the stability criteria. Due to matching considerations the MOS devices may be longer than their minimum length and hence $\omega_t$ may be approaching $\omega_0$ of the filter why non-quasi-static effects become significant in this case.

When the gyrator is tuned by $C_{gs}$ and $g_m$ (i.e. the reactive load is due to $y_i$, and others as in equation (6)) the MOS transistor will operate closely to $\omega_t$ and it is necessary to include non-quasi-static charging effects not only in the transadmittance expression but also in the input admittance $y_i$. For minimum-length devices the gate resistance also becomes a factor but in low-frequency gyrator design this is not a problem.

The output admittance is often modeled as a conductance $g_d$ with sufficient accuracy but should otherwise be $g_d/(1+s*\tau_{gm})$ according to the aforementioned MOS transistor handbook by Y. P. Tsvidis of 1988.

The distributed and lossy nature of the channel adds an effective conductance $g_{ch} = \varepsilon g_m \approx 5g_m$ in series to $C_{gs}$. The channel charge then exhibits a low-pass character with time constant $\tau_{gs} = C_{gs}/g_{ch} \approx 1/5\omega_t$. The transconductance time constant is twice $\tau_{gs}$ such that $\tau_{gm} \sim 2/(5\omega_t)$. Often the effects due to $\tau_{gs}$ and $\tau_{gm}$ are however neglected in simulation models and one has to be very careful when interpreting simulation results.

By adding the resistive component in the input admittance and by inserting typical MOS parameters as above, equation (6) is reformulated as $$Y_{gyr} = \begin{pmatrix} 3\left(\dfrac{s \cdot C_{gs}}{1+s \cdot \tau gs} + 2C_{gd} + \dfrac{gd}{1+s \cdot \tau gm}\right) & -\dfrac{gm}{1+s \cdot \tau gm} \\ \dfrac{gm}{1+s \cdot \tau gm} & 3\left(\dfrac{s \cdot C_{gs}}{1+s \cdot \tau gs} + 2C_{gd} + \dfrac{gd}{1+s \cdot \tau gm}\right) \end{pmatrix} \quad (16)$$

where it was assumed that $\Delta gm$ can be neglected. Further $C_{gd}$ is typically insignificant compared with $C_{gs}$. Thus, equation (16) can be simplified and using the fact that $\tau_{gm}=2\tau_{gs}$ the characteristic equation of equation (16) can be derived as $$|Y_{gyr}| = \begin{vmatrix} \dfrac{3}{1+s \cdot \tau gm} & 0 \\ 0 & \dfrac{3}{1+s \cdot \tau gm} \end{vmatrix} \cdot \quad (17.1)$$

$$\begin{vmatrix} s \cdot C_{gs} \dfrac{1+s \cdot \tau gm}{1+s \cdot \tau gs} + g_d & -\dfrac{gm}{3} \\ \dfrac{gm}{3} & s \cdot C_{gs} \dfrac{1+s \cdot \tau gm}{1+s \cdot \tau gs} + g_d \end{vmatrix}$$

$$\approx \left(\dfrac{3}{1+s \cdot \tau gs}\right)^2 \cdot$$

$$\begin{vmatrix} s \cdot C_{gs}(1+s \cdot (\tau gm - \tau gs)) + g_d & -\dfrac{gm}{3} \\ \dfrac{gm}{3} & s \cdot C_{gs}(1+s \cdot (\tau gm - \tau gs)) + g_d \end{vmatrix} \approx$$

$$\left(\dfrac{3}{1+s \cdot \tau gs}\right)^2 \cdot$$

$$\begin{vmatrix} s \cdot C_{gs}(1+s \cdot \tau gs) + g_d & -\dfrac{gm}{3} \\ \dfrac{gm}{3} & s \cdot C_{gs}(1+s \cdot \tau gs) + g_d \end{vmatrix} = 0.$$

The stability condition—when expanding the last determinant of equation (17.1) since only right-plane poles need to be examined—is then:

$$4C_{gs}^6 \left(\dfrac{g_d}{\varepsilon gm} - \left(\dfrac{g_d}{\varepsilon gm}\right)^2 - \dfrac{g_d^2 + \dfrac{g_m^2}{9}}{\varepsilon^2 g_m^2}\right) \approx \quad (17.2)$$

$$4C_{gs}^6 \left(\dfrac{1}{\varepsilon A_0} - \left(\dfrac{1}{\varepsilon A_0}\right)^2 - \dfrac{1}{9\varepsilon^2}\right) > 0,$$

with the solution (under the assumption $A_0 >> 1$):

$$A_0 < 9\varepsilon \approx 45. \quad (18)$$

To meet the above criterion the gyrator devices can be scaled down in size as was already explained above with respect to the second embodiment. If only the core transistors are resized they have to be scaled more than equation (18) as the $g_d$ term corresponds to the sum of all output conductances.

As explained above with respect to the eight embodiment which includes the MOS transistor input admittance in the characteristic equation, a special relationship (18) holds for designing the channel length in case of also incorporating the input admittance effects in the stability analysis.

Ninth Embodiment

As explained above with reference to equations (13), (14), the stability of the gyrator may be studied with sufficient accuracy by letting $y_m = g_m - s^* c_m$ with $c_m \approx \varepsilon g_m/(2\omega_T) \approx C_{gs}/2.5$.

When the loading capacitance ($C_0$ of equation 13) is dominated by an external capacitor with negligible losses the stability condition of equation (18) or $$\sum C_{gsgyr} < \dfrac{3C_0\varepsilon}{2A_0} \approx \dfrac{C_0}{40} \quad (19)$$

is used. If the loading is dominated by lossy gate capacitances equation (18) or $$A_0 = \dfrac{g_{mN} + g_{mP}}{g_{dN} + g_{dP}} < 45. \quad (20)$$

can be used as a stability criterion. The two stability conditions (19, 20) can be compared by inserting $C_0 = 3C_{gs\,gyr}$, $A_0 = g_d/g_m = g/3/g_m, c_m = 2C_{gs}/\varepsilon$ in equation (14) yielding $$2\dfrac{C_{gs}}{\varepsilon} < 9\dfrac{g_d}{g_m} C_{gs} \equiv A_0 < \dfrac{9}{2}\varepsilon, \quad (21)$$

which is the same as equation (18) less a factor of two. By adding $C_0$ to the diagonal of equation (16) it can be seen that in (17.1) $C_{gs}$ gets multiplied by $s^*\tau_{gs}$ while $C_0$ gets multiplied by $s^*\tau_{gm}$. Since $\tau_{gm} \approx 2T_{gs}$ the difference between (21) and (18) is explained. Extra phase margin is, thus, introduced by $g_{ch}$ in series with $C_{gs}$ which makes the gyrator with internal load more stable. This change in phase margin was never mentioned by Nauta.

Adding an external capacitor seems to lower the stability margin by a factor of two. At the same time, however, the devices have to be scaled in size, or the resonance frequency will not be preserved, and the increased loading due to a higher $g_d$ (i.e. lower $A_0$) stabilizes the loop.

For the loop to be stable $g^*C > g_m^* c_m$ has to be fulfilled. As explained above, this constraint may be fulfilled by either reducing $c_m$ by scaling the gyration devices (i.e. by shrinking their length and width), or by increasing g by creating an imbalance in $\Delta y_m$. Both schemes are good candidates but mismatching the CM feedback such that $g = 3g_d + \alpha g_m$, where $\alpha$ is some 1–10% limits the dependence on the unreliable and poorly modeled $g_d$. Then the stability of the design mainly depends on $g_m$ and $\varepsilon$ which are relatively stable over process variations.

When an imbalance is created in the CM feedback it is advantageous to do so via the loading devices (shorted inverters) or the $y_f$ terms of (2) and (4) will not be identical and cancellation will not occur.

Tenth Embodiment

A further embodiment of the invention is to include the effects of N- and P-channel device differences. If it is here assumed that the N- and P-channel devices in the common mode feedback circuit and the core circuit are similar except for the mobility, then the only major difference between device types is in their $f_T$ cut-off frequency. In this case the input admittance is defined as follows:

$$y_i = \frac{s \cdot C_{gSN}}{1 + s \cdot \tau_{gsN}} + \frac{s \cdot C_{gsP}}{1 + s \cdot \tau_{gsP}} \quad (22)$$

$$\approx s \cdot C_{gsN} \cdot (1 - s \cdot \tau_{gsN}) + s \cdot C_{gsP} \cdot (1 - s \cdot \tau_{gsP})$$

$$\approx s \cdot (1 + \beta) C_{gsN} \left(1 - s \frac{1 + \beta^2}{1 + \beta} \tau_{gsN}\right)$$

$$\approx s \cdot (1 + \beta) C_{gsN} (1 - s \beta \tau_{gsN}),$$

with $\beta$ being the ratio of N- and P-device $f_T$. The above approximations show that the capacitance will be the sum of the capacitors but that the time constant will be dominated by the P-devices (since $\beta \approx 3$).

In a similar fashion the gyration (trans-) conductance can be defined as $$g_m = \frac{g_{mN}}{1 + s \cdot \tau_{gmN}} + \frac{g_{mP}}{1 + s \cdot \tau_{gmP}} \quad (23)$$

$$\approx g_{mN}(1 - s \cdot \tau_{gmN}) + g_{mP}(1 - s \cdot \tau_{gmP})$$

$$\approx 2g_m \left(1 - s \tau_{gm} 1 + \frac{\beta}{2}\right),$$

where we have assumed that the transconductances are the same and that the time constants differ by the factor $\beta$.

To consider N- and P-device differences it, thus, suffices to a first order to insert the sum of the $C_{gs}$ and $g_m$ contributions in the formulas. The time constants may be approximated to $t_{gs} \approx \tau_{gsP}$ and $t_{gm} \approx (\tau_{gmN} + T_{gmP})/2$ or with the longest time constant and the average time constant, respectively. If these approximate values are inserted into equations (15) and (18) the following conditions for stability are derived:

$$C_{gS\ gyr} < C_0/40/\beta \quad (24)$$

$$A_0 < \frac{9}{2} \varepsilon / \beta \quad (25)$$

Eleventh Embodiment

Figure 4:
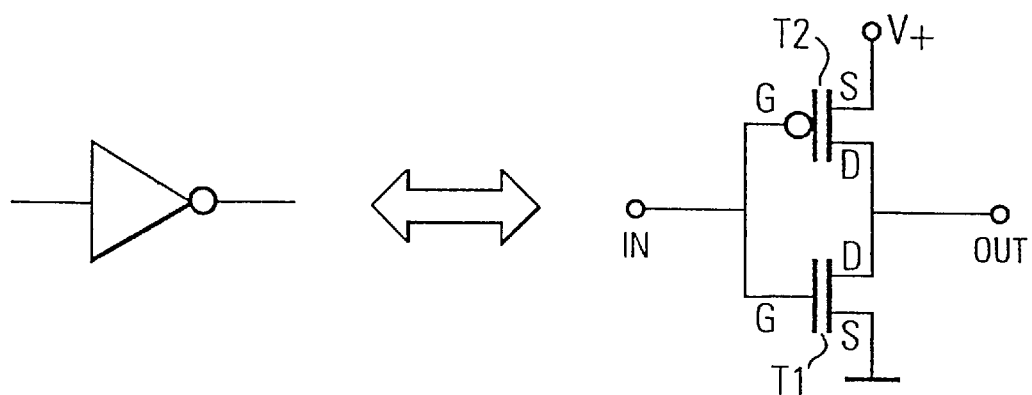
FIG. 4 shows a CMOS transistor construction of an inverter used in FIG. 3.
Figure 5A:
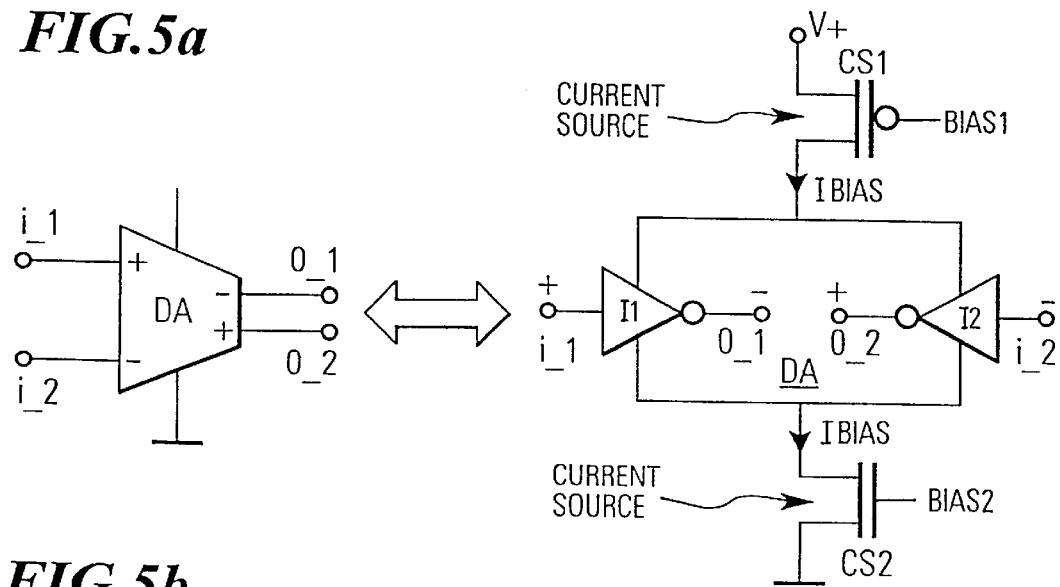
FIG. 5a shows an equivalent circuit diagram of differential transconductor.
Figure 5B:
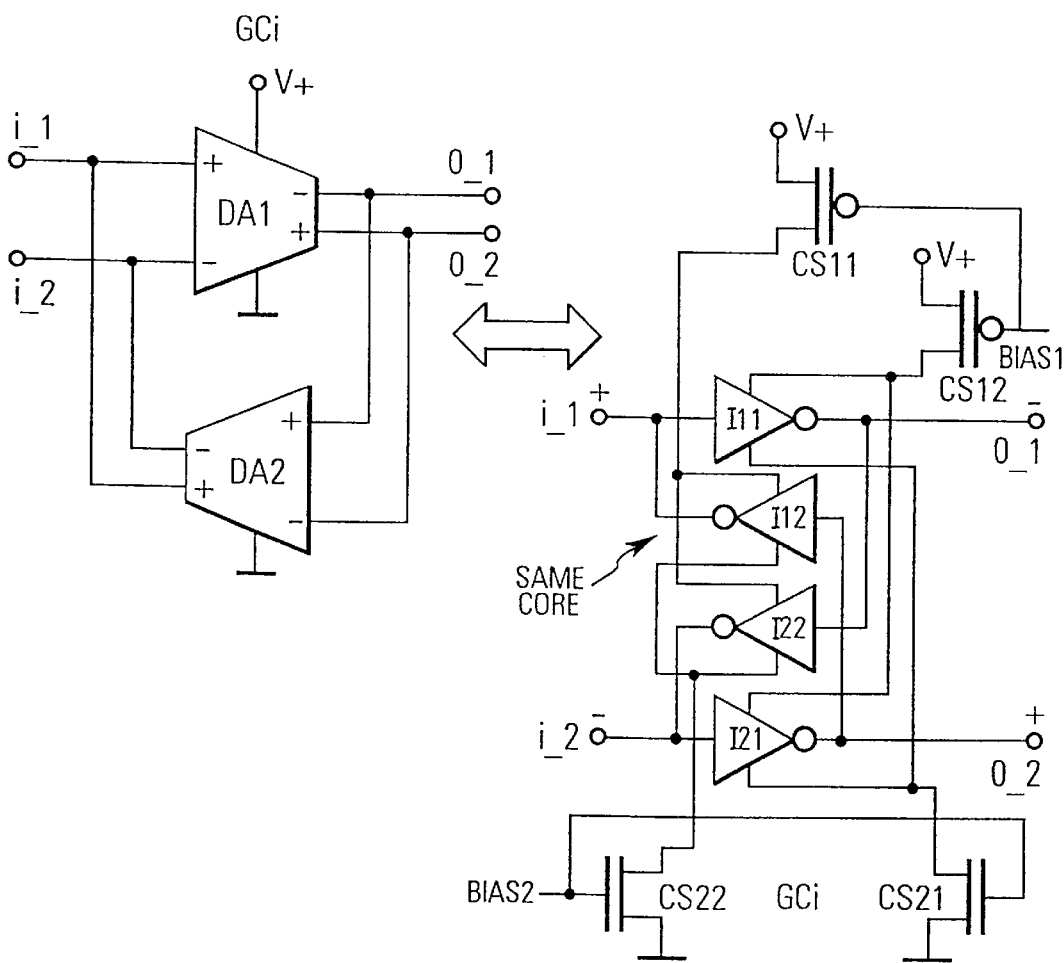
FIG. 5b shows a differential transconductor realization of the gyrator core section GCi shown in FIG. 3.

The above described embodiments state a number of stability criteria which can be used for a filter circuit including a gyrator core section GCi and at least one common mode feedback section CMIi, CMOi, as for example shown in FIG. 3. However, a similar stability analysis also holds for a filter circuit without a ommon mode feedback section and with a gyrator core section GCi having a differential transconductor configuration as shown in FIG. 5a, FIG. 5b. As shown in FIG. 5b two differential transconductors DA1, DA2 are provided in a feedback loop in order to form the gyrator core GCi. If each transconductor DA1, DA2 is embodied as shown in FIG. 5a, then the circuit in FIG. 5b with four inverters I11, I12, I22, I21 is formed. As shown in FIG. 5a, each transconductor DA is supplied with a bias current Ibias from two current sources CS1, CS2 which are formed by FET-transistors. Thus, the input terminals i_1, i_2 are the inputs to the two inverters I1, I2 and the output terminals o_1, o_2 are the output terminals of the inverters I1, I2. If the circuit in FIG. 5a is used twice to form the feedback loop, then four current sources CS11, CS12, CS21, CS22 and four inverters I11, I12, I22, I21 are used for forming a gyrator core section GCi of the filter state. Again, each inverter may be formed by transistors as shown in FIG. 4 with respect to the description of the inverters used in FIG. 3.

It may be noted, that in the filter stage in FIG. 5b only one gyrator core section with four inverters mutually connected in a loop configuration between a pair of input terminals i_1, i_2 and a pair of output terminals o_1, o_2 are used in the differential transconductor configuration without any additional common mode feedback sections as in FIG. 3. However, of course the circuit in FIG. 5b also has an effective conductive loading of the gyrator core section terminals g, an effective capacitive loading of the gyrator core section terminals C, an effective gyrating constant of the gyrator core section $g_m$ and an effective transcapacitant of the gyrator core section $c_m$. However, the stability criteria can at least with respect to the selection of the channel region dimensions of the transistors of the gyrator core section inverters I11, I12, I22, I21 be used as in the stability analysis of FIG. 3. That is, the channel region dimension of the transistors of the gyrator core section are selected such that the relationship $g^*C \geq g_m^* c_m$ is fulfilled. For example, the channel region length of the gyrator core section transistors is reduced, wherein the transadmittance of the respective transistor is changed. All transistors of the inverters in the gyrator core section can be selected to be identical. Furthermore, the channel region length and the channel region width of the gyrator core section transistors can be reduced, wherein the transadmittance of the respective transistor is kept constant. All other explanation regarding the stability analysis as regards the fulfillment of the aforementioned condition by changing the channel region dimensions, in particular by shortening the channel length, as explained above can be used also in FIG. 5b.

Hereinafter, the example circuit of FIG. 5b will be explained with more details. The gates of the current source transistors CS11, CS12 are connected together and their source terminals are connected to a positive power supply V+. Likewise, the gates of the current source transistors CS22, CS12 are connected together and their drains are connected to ground. The current from the current source CS11 feeds the inverters I12, I22 and the current from the current source CS12 feeds the inverters I11, I21. The current source CS22 feeds the inverters I12, I22 and the current source CS21 feeds the inverters I11, I21. The input terminals i_1, i_2 of the gyrator core section GCi are the input terminals to the inverters I11, I21. The output terminal o_1, o_2 of the gyrator core sections GCi are the output terminals of the inverters I11, I21. The output of the inverter I11 is connected to the input of the inverter I22 whose output is connected to the input of the inverter I21. The output of the inverter I21 is connected to the input of the inverter I12 whose output is connected to the input of the inverter I11. Thus, an inverter is respectively present in the forward path between an input terminal i_1; i_2 and the respective output terminal o_1; o_2. The respective output terminal o_1 is coupled back to the second input terminal i_2 through an inverter an the output terminal o_2 is fed back to the first input terminal i_1 via another inverter. As explained above, the stability criterion in equation (11) can also be used for this type of circuit if the channel region dimensions, in particular the channel length of the inverter transistors is reduced.

INDUSTRIAL APPLICABILITY

The above embodiments are all based on the central stability equation (11) which can be obtained on the basis of a zero model approximation or a pole model approximation for the MOS transadmittance $y_m$.

Furthermore, the input admittance can be included in the characteristic equation according to equation (17.1) leading to the stability criterion (18).

It has also been shown that the stability criteria are the same when the loading capacitance is dominated by an external capacitor and when it is not dominated. Furthermore, the effects of N- and P-channel device differences are included in a stability criterion according to equations (24), (25).

As explained above, by using the central stability equation (11) and by selecting the channel region dimensions in the core and in the common mode feedback filters can be obtained which are stable even at high frequencies and even when realizing higher-order filters.

Furthermore, the invention is not restricted to the above-described embodiments and further embodiments of the invention can be devised on the teachings contained therein. In particular, the invention can comprise embodiments which consist of features which have been separately described in the specification and/or claimed in the following claims.

In the claims reference numerals are only used for illustration purposes and do not limit the scope of the invention.

What is claimed is:

1. A method for making a filter circuit comprising at least one filter stage, the method comprising:

a) providing the at least one filter stage with a gyrator core section having four inverters mutually connected in a loop configuration between a pair of input terminals and a pair of output terminals;

b) providing at least one common mode feedback section, the at least one common mode feedback section being connected between at least one said pair of input terminals and said pair of output terminals and comprising two series connections respectively formed by an inverter and a short-sectioned inverter connected antiparallely between at least one of said input terminals and said output terminals, each of said inverters including at least one of a MOS, CMOS, and BiCMOS transistor, the at least one of a MOS, CMOS, and BiCMOS transistor having a gate, drain, source, and a channel region between said drain and source, and c) wherein the channel region dimensions of the transistors of at least one of the gyrator core section and the common mode feedback section are selected such that the following relationship is fulfilled:

$$g^*C \geq g_m^* c_m$$

where:
   g=effective conductive loading of the gyrator core section terminals;
   C=effective capacitive loading of the gyrator core section terminals;
   $g_m$=effective gyrating constant of the gyrator core section; and
   $c_m$=effective transcapacitance of the gyrator core section.

2. The method according to claim 1, wherein:
the channel region dimensions are changed differently in said gyrator core section and in said common mode feedback section.

3. The method according to claim 1, wherein:
the channel region dimensions of the common mode feedback section transistors are kept constant and the channel region length of the gyrator core section transistors is reduced; and the transadmittance of the respective transistor is changed.

4. The method according to claim 1, wherein:
the channel region dimensions of the common mode feedback section transistors are kept constant;

the channel region length and the channel region width of the gyrator core section transistors are reduced; and
the transadmittance of the respective transistor is kept constant such that the resonance frequency of the core section is larger than the resonance frequency of the filter.

5. The method according to claim 1, wherein:
the channel region dimensions of the gyrator core section transistors are kept constant; and
the channel region width of common mode ballast inverters of the common mode feedback section transistors is increased.

6. The method according to claim 1, wherein:
the channel region length of the gyrator core section transistors is reduced; the transadmittance of the respective transistor is changed; and
the channel region width of the common mode feedback section transistors is increased.

7. The method according to claim 1, wherein:
the channel region length and channel region width of the gyrator core section transistors are reduced; the transadmittance of the respective transistor is kept constant; and
the channel region width of the common mode feedback section transistors is increased.

8. The method according to claim 1, further comprising selecting all transistors in said common mode feedback section and said gyrator core section to be identical.

9. The method according to claim 8, wherein:
the transistors of each of the inverters include a transistor structure having a gate/source capacity $C_{gs}$, a gate/drain capacity $C_{gd}$, an output conductance $g_d$ and a transadmittance $y_m$ consisting of a resistive part $g_m$ and a capacitive part $c_m$;
the values of $g^*C \geq g_m^* c_m$ are defined as:

$$g = 3g_d$$

$$C = C_o + 3C_{gs} + 6C_{gd}; \text{ and}$$

$C_o$ is the total effective capacitance between the gyrator core terminals due to at least one of the common mode feedback section and additional external capacitances.

10. The method according to claim 1, further comprising selecting all transistors in said common mode feedback section and said gyrator core section to be different.

11. The method according to claim 1, wherein the channel length of the common mode inverters is increased.

12. The method according to claim 1, wherein the channel length of the common mode inverters is increased.

13. A filter circuit comprising at least one filter stage, the at least one filter stage comprising:

a) a gyrator core section having four inverters mutually connected in a loop configuration between a pair of input terminals and a pair of output terminals;

b) at least one common mode feedback section connected between at least one of the the pair of input terminals and the pair of output terminals and comprising two series connections respectively formed by an inverter and a shortsectioned inverter connected antiparallely between at least one said input terminals and said output terminals;

c) each of said inverters comprising at least one MOS, CMOS or BiCMOS transistor, each of the at least one of a MOS, CMOS or BiCMOS transistors having a gate, drain, source, and a channel region between said drain and source;

d) wherein the channel region dimensions of the transistors of at least one of the gyrator core section and the common mode feedback section are selected such that the following relationship is fulfilled:

$$g*C \geq g_m*c_m; \text{ and}$$

where:
g=effective conductive loading of the gyrator core section terminals;
C=effective capacitive loading of the gyrator core section terminals;
$g_m$=effective gyrating constant of the gyrator core section; and
$c_m$=effective transcapacitance of the gyrator core section.

14. The filter circuit according to claim 13, wherein the channel region dimensions are selected to be different in said gyrator core section and in said common mode feedback section.

15. The filter circuit according to claim 13, wherein:
the channel region dimensions of the common mode feedback section transistors are kept constant;
the channel region length of the gyrator core section transistors is reduced; and
the transadmittance of the respective transistor is changed.

16. The filter circuit according to claim 13, wherein:
the channel region dimensions of the common mode feedback section transistors are kept constant;
the channel region length and the channel region width of the gyrator core section transistors are reduced and;
the transadmittance of the respective transistor is kept constant such that the resonance frequency of the core section is larger than the resonance frequency of the filter circuit.

17. The filter circuit according to claim 13, wherein:
the channel region dimensions of the gyrator core section transistors are kept constant; and
the channel region width of common mode ballast inverters of the common mode feedback section transistors is increased.

18. The filter circuit according to claim 13, wherein:
the channel region length of the gyrator core section transistors is reduced;
the transadmittance of the respective transistor is changed; and
the channel region width of the common mode feedback section transistors is increased.

19. The filter circuit according to claim 13, wherein:
the channel region length and channel region width of the gyrator core section transistors is reduced;
the transadmittance of the respective transistor is kept constant; and
the channel region width of the common mode feedback section transistors is increased.

20. The filter circuit according to claim 13, wherein all transistors in said common mode feedback section and said gyrator core section are identical.

21. The filter circuit according to claim 20, wherein:
the transistors of each of the inverters comprise a transistor structure having a gate/source capacity $C_{gs}$, a gate/drain capacity $C_{gd}$, an output conductance $g_d$, and a transadmittance $y_m$ consisting of a resistive part $g_m$ and a capacitive part $c_m$;

the values of $g*C \geq g_m*c_m$ are defined as:

$$g=3g_d; \text{ and}$$

$$C=C_o+3C_{gs}+6C_{gd}; \text{ and}$$

$C_o$ is the total effective capacitance between the gyrator core terminals due to the common mode feedback section and/or additional external capacitances.

22. The filter circuit according to claim 13, wherein all transistors in said common mode feedback section and said gyrator core section are different.

23. The filter circuit according to claim 13, wherein said transistors are operated in saturation.

24. The filter circuit according to claim 13, wherein said filter circuit is a differential signal type filter circuit.

25. The method for making a filter circuit comprising at least one filter stage, the method comprising:
a) providing said at least one filter stage with a gyrator core section having four inverters mutually connected in a feedback loop between a pair of input terminals and a pair of output terminals;
b) wherein the inverters are arranged as a differential transconductor configuration, such that a first and second inverter are respectively provided between the first input and first output terminal and the second input terminal and the second output terminal;
c) each of said inverters comprises at least one of a MOS, CMOS, and BiCMOS transistor, the at least one of a MOS, CMOS, and BiCMOS transistor having a gate, drain, source, and a channel region between said drain and source; and
d) selecting the general region dimensions of the transistors of the gyrator core section such that the following relationship is fulfilled:

$$g*C \geq g_m*c_m, \text{ wherein}$$

where:
g=effective conductive loading of the gyrator core section terminals;
C=effective capacitive loading of the gyrator core section terminals;
$g_m$=effective gyrating constant of the gyrator core section; and
$c_m$=effective transcapacitance of the gyrator core section.

26. The method according to claim 25, wherein:
the channel region length of the gyrator core section transistors is reduced; and
the transmittance of the respective transistor is changed.

27. The method according to claim 25, wherein:
the channel region length and the channel region width of the gyrator core section transistors is reduced; and
the transadmittance of the respective transistor is kept constant.

28. The filter circuit comprising:
a) at least one filter stage with a gyrator core section having four inverters mutually connected in a feedback loop between a pair of input terminals and a pair of output terminals;
b) wherein the inverters are arranged as a differential transconductor configuration, such that a first and second inverter are respectively provided between the first input and first output terminal and the second input terminal and the second output terminal;
c) wherein each of said inverters comprises at least one of a MOS, CMOS, and BiCMOS transistor, the at least one of a MOS, CMOS, and BiCMOS transistor having a gate, drain, source, and a channel region between said drain and source;

d) wherein the general region dimensions of the transistors of the gyrator core section are selected such that the following relationship is fulfilled:

$$g*C \geq g_m*c_m;$$

where:
g=effective conductive loading of the gyrator core section terminals;
C=effective capacitive loading of the gyrator core section terminals;
$g_m$=effective gyrating constant of the gyrator core section; and
$c_m$=effective transcapacitance of the gyrator core section.

29. The filter circuit according to claim 28, wherein:
the channel region length of the gyrator core section transistors is reduced; and
the transmittance of the respective transistor is changed.

30. The filter circuit according 28, wherein:
the channel region length and the channel region width of the gyrator core section transistors is reduced; and
the transadmittance of the respective transistor is kept constant.

* * * * *

UNITED STATES PATENT AND TRADEMARK OFFICE
CERTIFICATE OF CORRECTION

PATENT NO. : 6,490,706 B2
DATED : December 3, 2002
INVENTOR(S) : Sven Mattisson

It is certified that error appears in the above-identified patent and that said Letters Patent is hereby corrected as shown below:

Column 19,
Line 29, replace "at least one said" with -- at least one of said --
Line 38, replace "source, and" with -- source; and --

Column 20,
Line 34, replace "consisting of" with -- comprising --
Line 63, replace "at least one MOS," with -- at least one of a MOS, --
Line 64, replace "CMOS or BiCMOS" with -- CMOS and BiCMOS --
Line 65, replace "Mos, CMOS or BiCMOS transistors" with
-- MOS, CMOS, and BiCMOS transistor --

Column 21,
Line 7, replace "where:" with -- wherein: --
Line 66, replace "consisting of" with -- comprising --

Column 22,
Line 15, replace "The method for" with -- A method of --
Line 27, replace "c) each of said" with -- c) wherein each of said --
Line 55, replace "The filter circuit" with -- A filter circuit --

Signed and Sealed this

Tenth Day of June, 2003

JAMES E. ROGAN
*Director of the United States Patent and Trademark Office*